(12) United States Patent
Kawaguchi et al.

(10) Patent No.: US 8,400,011 B2
(45) Date of Patent: Mar. 19, 2013

(54) ILLUMINATION DEVICE, AUTOMOTIVE LIGHTING EQUIPMENT, AND VEHICLE

(75) Inventors: Yoshinobu Kawaguchi, Osaka (JP);
Kenichi Yoshimura, Osaka (JP);
Masamichi Harada, Osaka (JP);
Katsuhiko Kishimoto, Osaka (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 407 days.

(21) Appl. No.: 12/885,073

(22) Filed: Sep. 17, 2010

(65) Prior Publication Data

US 2011/0084609 A1   Apr. 14, 2011

(30) Foreign Application Priority Data

Oct. 14, 2009   (JP) ................................. 2009-237076

(51) Int. Cl.
*B60L 1/00* (2006.01)
(52) U.S. Cl. ........................................................ 307/9.1
(58) Field of Classification Search .................... 307/9.1
See application file for complete search history.

(56) References Cited

U.S. PATENT DOCUMENTS

| 2003/0030808 | A1 | 2/2003 | Marshall et al. |
| 2004/0137265 | A1 | 7/2004 | Shimada et al. |
| 2005/0236628 | A1 | 10/2005 | Matsuura |
| 2011/0043764 | A1 | 2/2011 | Narikawa |

FOREIGN PATENT DOCUMENTS

| CN | 1661825 | 8/2005 |
| JP | 2001-12921 | 1/2001 |
| JP | 2004-533097 | 10/2004 |
| JP | 2004-354495 | 12/2004 |
| JP | 3107924 | 4/2005 |
| JP | 2008-73346 | 4/2008 |
| JP | 2011-44367 | 3/2011 |
| WO | WO-02/091487 | 11/2002 |

*Primary Examiner* — Robert L. Deberadinis
(74) *Attorney, Agent, or Firm* — Morrison & Foerster LLP

(57) ABSTRACT

An illumination device improved in safety to the eye is provided. The illumination device includes: a semiconductor laser element to serve as an excitation light source which emits laser light; a fluorescent plate which contains a fluorescent substance for emitting light of a desired color and is irradiated with laser light emitted from the semiconductor laser element; a light receiving element part which detects light reflected from the fluorescent plate; and a light source control part which controls laser light emitted from the semiconductor laser element based on a detection signal from the light receiving element part.

15 Claims, 13 Drawing Sheets

ILLUMINATION DEVICE, AUTOMOTIVE LIGHTING EQUIPMENT, AND VEHICLE

This application is based on Japanese Patent Application No. 2009-237076 filed on Oct. 14, 2009, the contents of which are hereby incorporated by reference.

BACKGROUND OF THE INVENTION

1. Field of the Invention

The present invention relates to an illumination device, an automotive lighting equipment which uses the illumination device, and a vehicle to which the automotive lighting equipment is mounted.

2. Description of Related Art

There have been known illumination devices in which light emitted from a semiconductor light emitting element such as a light emitting diode element or a semiconductor laser element is combined as excitation light with a fluorescent substance. Many light emitting diode elements and semiconductor laser elements that serve as an excitation light source use a nitride semiconductor that emits light in the ultraviolet to blue wavelength range. The fluorescent substance chosen to be combined with those excitation light sources is a material capable of converting light in the ultraviolet to blue wavelength range into green to red light through wavelength conversion. An illumination device that casts light of desired color is thus obtained. This type of illumination device is disclosed in, for example, WO 2002/091487.

Light emitted from a semiconductor light emitting element is harmful to the human body when the intensity of the light reaches a certain level. Laser light emitted from a semiconductor laser element, in particular, is coherent light which, upon entering the human eye directly, rises to an extremely high power density and hurts the eye.

The type of illumination device described above, even one having a semiconductor laser element as its light source, does not have the problem regarding the safety to the human eye because laser light scattered by a fluorescent substance is no longer coherent light. It has therefore been proposed to use a semiconductor laser element as a light source (excitation light source) in place of a light bulb or other conventional light sources.

For instance, JP 2008-73346 A proposes an electronic endoscopic device using a semiconductor laser as the light source of illumination light which illuminates an object inside a lumen. The electronic endoscopic device includes an endoscope insertion part and a device main body joined to the endoscope insertion part. In the device main body, a semiconductor laser element (laser chip) is installed as the light source. Laser light emitted from the semiconductor laser element is transmitted along a communication fiber laid in the endoscope insertion part, and irradiates a fluorescent filter (fluorescent member) provided at the tip of the endoscope insertion part. Irradiated with the laser light, the fluorescent filter emits white light to illuminate the object. An image pickup unit including an image sensor is also provided at the tip of the endoscope insertion part. The image pickup unit is driven by a signal processing part, which is provided in the device main body, and signal processing is performed on an image pickup signal from the image pickup unit, to thereby display an endoscopic image on a monitor.

With this type of electronic endoscopic device, there is a fear that damage to the device such as the breakage of the communication fiber may cause laser light to leak out of the endoscope insertion part. JP 2008-73346 A employs an illumination system that does not allow laser light to leak out of the endoscope insertion part in such situations. Specifically, the illumination system is structured to electrically sense the breakage or short circuit of a cable connecting the signal processing part and the image pickup unit and, upon detection of the breakage or short circuit of the cable, laser light output is controlled to prevent laser light from leaking out of the endoscope insertion part.

However, the illumination system described in JP 2008-73346 A is hardly applicable to other devices than endoscopic devices. Even if one manages to apply the illumination system to other uses, the application causes inconvenience by complicating the structure of the device to which the illumination system is applied. The inconvenience leads to a problem in that size reduction is difficult for the device to which the illumination system is applied when the device is not an endoscopic device and is intended for other uses such as general illumination.

When applied to general illumination or similar uses, the type of illumination device described above also has a fear that an accident such as the fluorescent substance (fluorescent member) falling off may cause emitted laser light to directly enter a person's eye. The safety of the illumination device to the human eye therefore drops in the event of such accidents.

SUMMARY OF THE INVENTION

The present invention has been made to solve those problems, and an object of the present invention is therefore to provide an illumination device improved in safety to the eye, an automotive lighting equipment, and a vehicle to which the automotive lighting equipment is applied.

Another object of the present invention is to provide an illumination device which has a simplified structure and is accordingly reduced in size, an automotive lighting equipment, and a vehicle to which the automotive lighting equipment is applied.

In order to achieve the above-mentioned object, an illumination device according to a first aspect of the present invention includes: a light source which emits light of a specific wavelength; a fluorescent member which contains a fluorescent substance and is irradiated with light emitted from the light source; a reflected light sensing part which detects the specific wavelength among light reflected from the fluorescent member; and a light source control part which controls light emitted from the light source based on a detection signal of the reflected light sensing part.

The illumination device according to the first aspect, which includes the reflected light sensing part for detecting reflected light from the fluorescent member as described above, is capable of detecting an anomaly in the fluorescent member (for example, the falling off, chipping (damaging), or displacing of the fluorescent member) based on a change in the reflected light. The reflected light from the fluorescent member refers to a portion of light emitted from the light source that is reflected instead of absorbed by the fluorescent member, whereas light absorbed and subjected to wavelength conversion by the fluorescent member is herein called illumination light. Based on a detection signal from the reflected light sensing part, the light source control part controls light emitted from the light source. Light from the light source is thus prevented from leaking directly to the outside in the event of an accident such as the detaching of or damage to the fluorescent member. In this manner, light from the light source is prevented from directly hitting a person's body and is consequently prevented from directly entering the person's eye. The illumination device structured as above is therefore improved in safety to the human eye.

In the first aspect, where the reflected light sensing part is provided to facilitate the detection of an anomaly in the fluorescent member as described above, the safety is improved without complicating the structure of the illumination device. In other words, an improvement in safety is accomplished with a simple structure. The illumination device can therefore be reduced in size with ease. The illumination device according to the first aspect, which is easy to simplify the structure and to reduce the size, is readily applicable to uses where structural simplification is imperative, such as general illumination including home illumination and automobile headlights, and light sources for displays.

In the illumination device according to the first aspect, the light source may include a semiconductor light emitting element. In this case, it is preferred that the light source include a semiconductor laser element. The light source may also include a light emitting element that is not a semiconductor laser element. For instance, the light source may include a light emitting diode element.

In the illumination device according to the first aspect, it is preferred that the reflected light sensing part include a light receiving element. Structured as this, the illumination device detects an anomaly in the fluorescent member with ease by detecting reflected light from the fluorescent member.

In the illumination device according to the first aspect, the reflected light sensing part may detect a change in reflected light intensity which corresponds to a displacement amount of the fluorescent member, and then output the detection signal to the light source control part. Structured as this, the illumination device easily detects how light from the light source is being supplied to the fluorescent member. The illumination device can thus prevent the displacing of the fluorescent member or a similar accident from causing the inconvenience of at least a portion of light from the light source leaking directly to the outside. The reflected light sensing part may also output a detection signal to the light source control part upon detecting a change in the intensity of reflected light in relation to the angle of incidence of reflected light on the reflected light sensing part.

In the illumination device according to the first aspect, the reflected light sensing part may include a light receiving element, which is divided to have four light receiving regions.

In the illumination device according to the first aspect, it is preferred that the fluorescent member be provided with a reflective region made from a material that is different from the fluorescent substance. This structure increases the amount of light that travels toward the reflected light sensing part and accordingly enhances the detection accuracy of the reflected light sensing part. The safety to the human eye is thus improved even more.

It is preferred that the illumination device according to the first aspect further include an optical filter, which is placed between the fluorescent member and the reflected light sensing part to block at least a portion of illumination light emitted from the fluorescent member. This structure improves the accuracy of detecting reflected light even more.

In the illumination device according to the first aspect, it is preferred that the fluorescent member be shaped like a plate. With this structure, it is easy to set up the fluorescent member such that reflected light enters the reflected light sensing part. This structure also facilitates the machining of the fluorescent member.

In the illumination device according to the first aspect, the fluorescent member may include a plurality of fluorescent regions designed to emit light of colors different from one another. In this case, it is preferred that the illumination device further include a fluorescent member driving part for moving the fluorescent member. With this structure, the fluorescent member driving part moves the fluorescent member such that light from the light source irradiates the desired one of the fluorescent regions. The color or tint of illumination light emitted from the fluorescent member can thus be changed.

In the structure in which the fluorescent member is provided with the reflective region, the reflective region may have at least one of a convex part and a concave part. The illumination device structure as this can detect with higher precision how light from the light source is being supplied to the fluorescent member by detecting reflected light that is reflected from the convex part or the concave part with the use of the reflected light sensing part.

An automotive lighting equipment according to a second aspect of the present invention includes the illumination device according to the first aspect. The automotive lighting equipment structured as this is improved in safety to the eye and reduced in size, and yet easy to realize.

A vehicle according to a third aspect of the present invention includes the automotive lighting equipment according to the second aspect.

The vehicle according to the third aspect may further include a collision detecting part for detecting a collision, and the light source control part may control light emitted from the light source based on a detection signal from the collision detecting part.

A vehicle according to a fourth aspect of the present invention includes: an automotive lighting equipment comprising an illumination device; and a collision detecting part for detecting a collision. The illumination device includes: a light source which emits light of a specific wavelength; a fluorescent member which is irradiated with light emitted from the light source; and a light source control part which controls light emitted from the light source. Further, the light source control part controls light emitted from the light source based on a detection signal from the collision detecting part.

In the vehicle according to the fourth aspect, where the light source control part is structured to control light emitted from the light source based on a detection signal from the collision detecting part, light from the light source is prevented from entering the eyes of people in the vicinity of the vehicle when the vehicle is damaged by a collision.

In the vehicle according to the fourth aspect, it is preferred that the light source of the illumination device include a semiconductor laser element.

As described above, according to the present invention, an illumination device, an automotive lighting equipment, and a vehicle which are improved in safety to the eye are obtained with ease.

The present invention also makes it easy to obtain an illumination device, an automotive lighting equipment, and a vehicle which are simplified in structure and accordingly reduced in size.

DETAILED DESCRIPTION OF PREFERRED EMBODIMENTS

The present invention is embodied by the following embodiments, which are described in detail with reference to the accompanying drawings. In the following embodiments, the "wavelength" of a light source means a peak wavelength in the light emission spectrum which ranges to a certain degree.

First Embodiment

Figure 1:
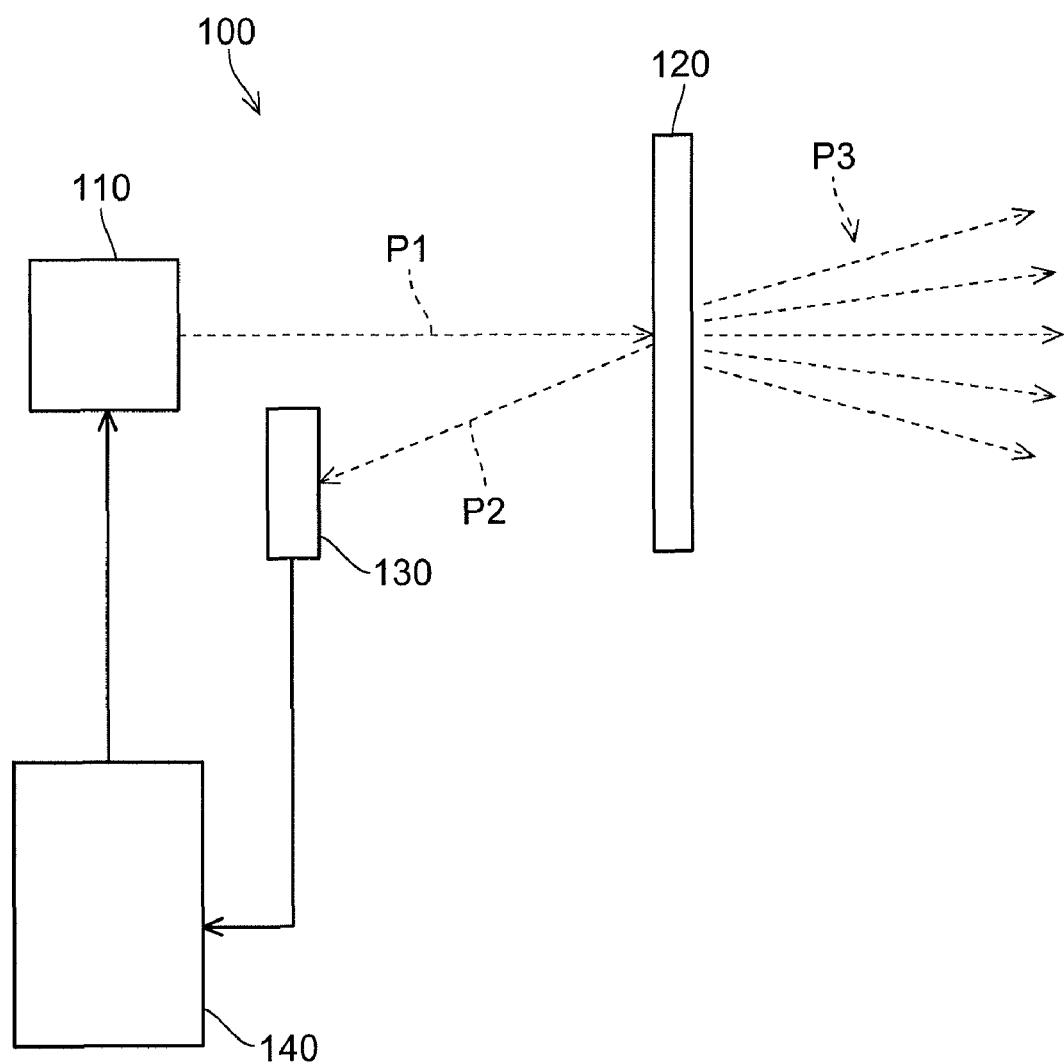
FIG. 1 is a block diagram schematically illustrating the structure of an illumination device according to a first embodiment of the present invention.
Figure 2:
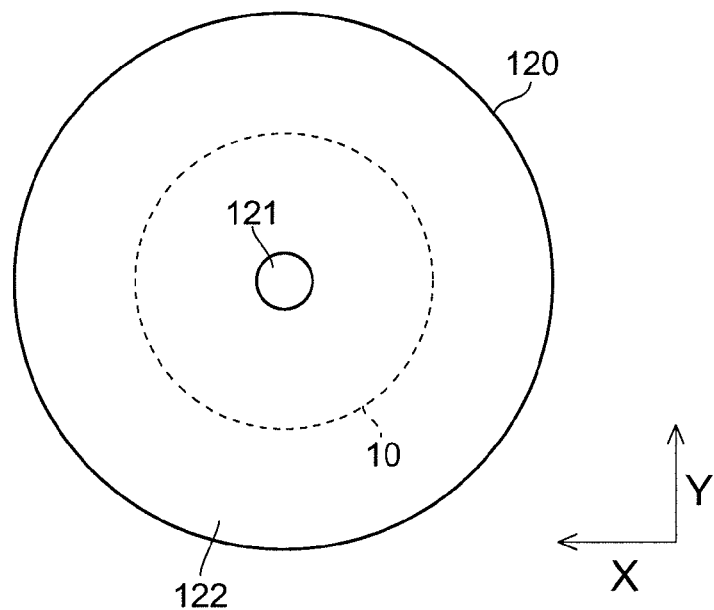
FIG. 2 is a plan view of a fluorescent plate of the illumination device according to the first embodiment of the present invention.

FIG. 1 is a block diagram schematically illustrating the structure of an illumination device according to a first embodiment of the present invention. FIG. 2 is a plan view of a fluorescent plate of the illumination device according to the first embodiment of the present invention. The fluorescent plate of FIG. 2 is viewed from the semiconductor laser element side. The illumination device according to the first embodiment of the present invention which is denoted by 100 is described first with reference to FIGS. 1 and 2.

The illumination device 100 according to the first embodiment includes, as illustrated in FIG. 1, a semiconductor laser element 110, which serves as an excitation light source, a fluorescent plate 120, which emits fluorescent light when irradiated with laser light that is emitted from the semiconductor laser element 110, a light receiving element part 130, which receives reflected light P2 from the fluorescent plate 120, and a light source control part 140, which controls the driving of the semiconductor laser element 110 based on a detection signal from the light receiving element part 130.

The semiconductor laser element 110 is an example of a "light source" of the present invention. The fluorescent plate 120 is an example of a "fluorescent member" of the present invention. The light receiving element part 130 is an example of a "reflected light sensing part" of the present invention.

The semiconductor laser element 110 is constituted of, for example, a blue-violet semiconductor laser that has a lasing wavelength of 405 nm. The material of this blue-violet semiconductor laser is an $Al_xGa_yIn_zN$ ($0 \leq x \leq 1$, $0 \leq y \leq 1$, $0 \leq z \leq 1$, $x+y+z=1$)-based nitride. The lasing wavelength of the semiconductor laser element 110 can be changed to the ultraviolet to green wavelength range by changing the material and composition of its active layer from which light is emitted.

The fluorescent plate 120 is formed by, for example, dispersing a fluorescent substance in a resin-based material such as silicone resin. The fluorescent plate 120 absorbs laser light emitted from the semiconductor laser element 110, and then emits light of a color determined by what fluorescent substance is dispersed. The employed fluorescent substance is a material suitable for the use of the illumination device 100. For instance, when used for general illumination, the illumination device 100 needs to emit white light. Fluorescent substances chosen for this use are those that respectively emit blue light (wavelength: 440 nm to 480 nm), green light (wavelength: 500 nm to 540 nm), and red light (wavelength: 610 nm to 650 nm) upon absorption of laser light that is emitted from the semiconductor laser element 110 and has a wavelength of 405 nm. Those fluorescent substances (the blue fluorescent substance, the green fluorescent substance, and the red fluorescent substance) are mixed and dispersed in the fluorescent plate 120.

Other combinations than the one given above may be employed, including the combination of a blue fluorescent substance and a yellow (wavelength: 540 nm to 580 nm) fluorescent substance, and the combination of a blue-green fluorescent substance (wavelength: 470 nm to 520 nm) and a red fluorescent substance. In the case where light of other colors than white is required, a desired emission light color is obtained by selecting an appropriate fluorescent substance.

To give concrete examples of employable fluorescent substances, a Ce-activated JEM phosphor, a Ce-activated La-n phase phosphor, an Eu-activated AlN phosphor, or the like can be used as a blue fluorescent substance. An Eu-activated β-SiAlON phosphor, a Ce-activated (Sr, Ca)AlSiN₃ phosphor, a Ce-activated $Sr_2Si_5N_8$ phosphor, a Yb-activated α-SiAlON phosphor, or the like can be used as a green fluorescent substance. An Eu-activated α-SiAlON phosphor, a YAG (yttrium aluminum garnet) phosphor, a Ce-activated CaAlSiN₃ phosphor, or the like can be used as a yellow fluorescent substance. An Mn-activated $0.5MgF_2 \cdot 3.5MgO \cdot GeO_2$ phosphor, an Eu-activated (Sr, Ca)AlSiN₃ phosphor, an Eu-activated CaAlSiN₃ phosphor, an Eu-activated $Sr_2Si_5N_8$ phosphor, or the like can be used as a red fluorescent substance. An Eu-activated $(Ba, Sr)_2Si_2O_2N_2$ phosphor or the like can be used as a blue-green fluorescent substance.

As illustrated in FIG. 2, the fluorescent plate 120 has a substantially circular shape in plan view. The fluorescent plate 120 has a diameter of approximately 5 mm to 50 mm and is formed to a thickness of approximately 1 mm to 5 mm. The distance between the semiconductor laser element 110 and the fluorescent plate 120 is set to, for example, 1 mm to 50 mm.

In the first embodiment, a reflective region 121 for reflecting laser light from the semiconductor laser element 110 is provided on a surface of the fluorescent plate 120 on the semiconductor laser element 110 side. Specifically, the reflective region 121 is provided substantially at the center of this surface of the fluorescent plate 120. The rest of this surface of the fluorescent plate 120, namely, the region that is not the reflective region 121, is a fluorescent region 122 which contains a fluorescent substance. In other words, the fluorescent plate 120 is constituted of the fluorescent region 122 which converts laser light from the semiconductor laser element 110 and the reflective region 121 which reflects laser light from the semiconductor laser element 110. The fluorescent region 122 is formed so as to surround the reflective region 121. The fluorescent region 122 is provided with a fluorescent substance, such as those given above, that is suitable for the use of the illumination device 100.

The reflective region 121 in the first embodiment is formed by, for example, deposition of a metal material such as aluminum. Instead, the reflective region 121 may be created from a dielectric mirror in which dielectric films having different refractive indices are layered alternately.

The reflective region 121 is set smaller than an irradiated region 10 (for example, approximately 1 mm to 10 mm in diameter), where the fluorescent plate 120 is irradiated with laser light, to be contained within the irradiated region 10. The reflective region 121 only needs to be large enough to ensure that the reflected light P2 is detected by the light receiving element part 130. When the reflective region 121 is too large relative to the irradiated region 10, less light is converted by the fluorescent region 122. In conclusion, the reflective region 121 preferably has a minimum area that allows the light receiving element part 130 to detect the reflected light P2.

The light receiving element part 130 is constituted of for example, a photodiode, and is disposed on the reflective region 121 side of the fluorescent plate 120 (the same side as the semiconductor laser element 110 with respect to the fluorescent plate 120) in order to receive the reflected light P2 from the fluorescent plate 120. Upon receiving the reflected light P2 from the fluorescent plate 120, the light receiving element part 130 converts the received reflected light P2 into an electrical signal. The light receiving element part 130 detects an anomaly in the fluorescent plate 120 based on a change in the reflected light P2. Detecting an anomaly in the fluorescent plate 120, the light receiving element part 130 which is connected to the light source control part 140 outputs a detection signal to the light source control part 140.

The light receiving element part 130 and the fluorescent plate 120 are arranged such that, when the fluorescent plate 120 is tilted at an angle θ from its normal position, the intensity of the reflected light P2 incident on the photodiode is changed.

The light source control part 140 includes a switch such as a switching element, and controls the driving of the semiconductor laser element 110 based on a detection signal from the light receiving element part 130. Specifically, when an anomaly in the fluorescent plate 120 is detected, the light source control part 140 opens the switch and thereby breaks electrical continuity to the semiconductor laser element 110.

The illumination device 100 may be structured such that an anomaly in the fluorescent plate 120 is detected by the light source control part 140. Alternatively, a circuit element or the like for detecting an anomaly in the fluorescent plate 120 may be provided between the light receiving element part 130 and the light source control part 140.

Figure 3:
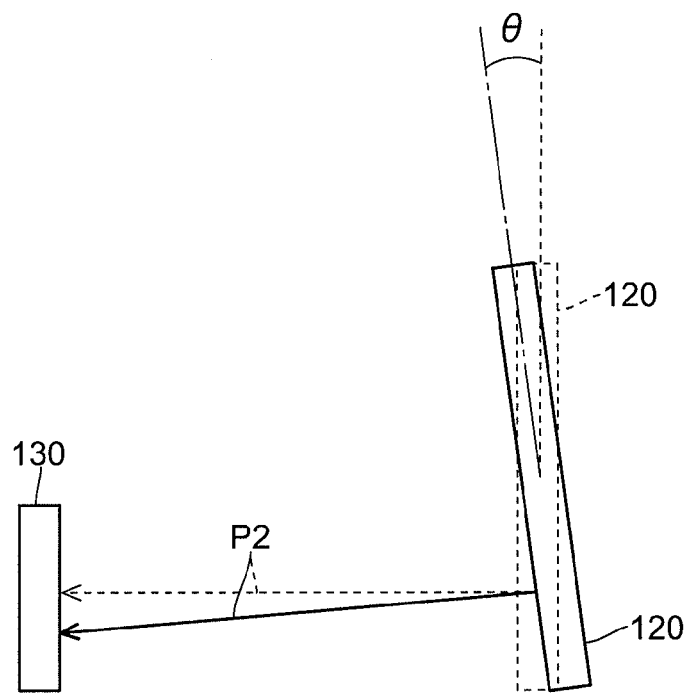
FIG. 3 is a diagram illustrating how the displacing of the fluorescent plate is detected in the illumination device according to the first embodiment of the present invention.
Figure 4:
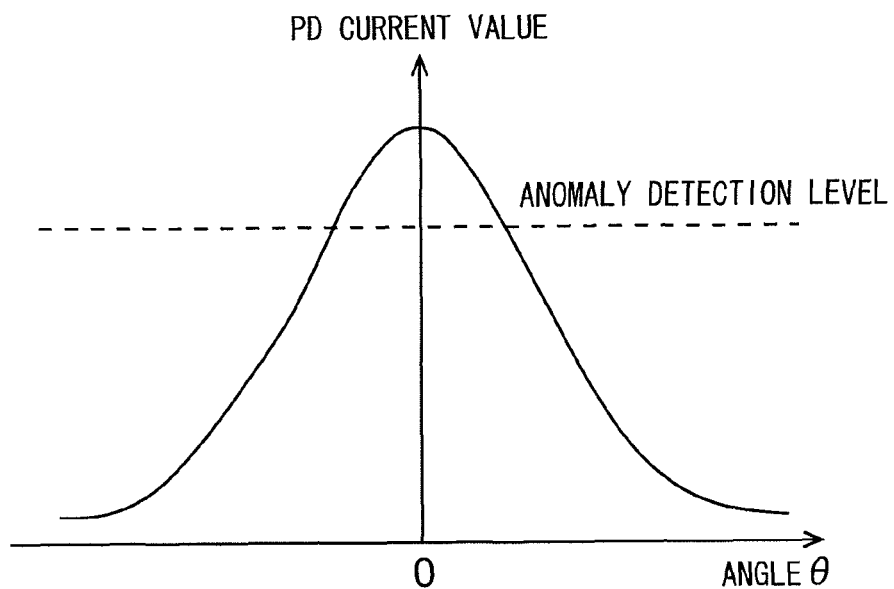
FIG. 4 is a graph illustrating how the displacing of the fluorescent plate is detected in the illumination device according to the first embodiment of the present invention.

FIGS. 3 and 4 are diagrams illustrating how the displacing of the fluorescent plate is detected in the illumination device according to the first embodiment of the present invention.

The operation of the illumination device 100 according to the first embodiment is described next with reference to FIGS. 1 to 4.

First, as illustrated in FIG. 1, the semiconductor laser element 110 emits laser light (exit light P1) as excitation light toward the fluorescent plate 120 and the laser light irradiates the fluorescent plate 120. Irradiated with the laser light, the fluorescent plate 120 puts the laser light through wavelength conversion performed by the contained fluorescent substance, and emits light of a color determined by what fluorescent substance is contained (for example, white light). Light emitted from the fluorescent substance (fluorescent plate 120) at this point acts as actual illumination light P3. Laser light that is emitted from the semiconductor laser element 110 to irradiate the fluorescent plate 120 thus does not act as illumination light as it is. Because light that enters the human eye from the illumination device 100 is light scattered via a fluorescent substance, the use of laser light as excitation light does not cause a safety problem.

A portion of the laser light irradiating the fluorescent plate 120 is reflected by the reflective region 121 (see FIG. 2) of the fluorescent plate 120. The reflected light P2 created by the reflection at the reflective region 121 is received by the light receiving element part 130, which monitors for an anomaly in the fluorescent plate 120.

Now, consider a case where, as illustrated in FIG. 3, the fluorescent plate 120 is displaced by vibrations or an impact from its normal position indicated by the broken line to a position indicated by the solid line, and is consequently tilted by the angle θ. Then, the angle of incidence of the reflected light P2 on the light receiving element part 130 is also shifted by the angle θ. The intensity of the reflected light P2 incident on the light receiving element part 130 is accordingly changed. A current flows into the photodiode (PD) that constitutes the light receiving element part 130 in an amount that is varied depending on the intensity of the reflected light, which establishes angle θ-PD current value characteristics illustrated in the graph of FIG. 4. When the PD current value is lower than an anomaly detection level, which is set to a certain current value, the light receiving element part 130 (see FIG. 1) outputs a detection signal to the light source control part 140 (see FIG. 1).

Receiving the detection signal from the light receiving element part 130, the light source control part 140 opens the switch to break electrical continuity to the semiconductor laser element 110.

In the case where the fluorescent plate 120 falls off, the reflected light P2 is no longer detected by the light receiving element part 130. In the case where the fluorescent plate 120 is damaged (chipped) to a degree that allows a leakage of laser light to the outside, the light receiving element part 130 detects the reflected light P2 that has an extremely low intensity or does not detect the reflected light P2 at all. An anomaly in the fluorescent plate 120 is thus detected easily also when the anomaly is other than displacing, such as the complete falling off of the fluorescent plate 120 or damage to (chipping of) the fluorescent plate 120.

Light emitted from the fluorescent substance (fluorescent light) may be used to detect an anomaly in the fluorescent plate 120 instead of the reflected light P2 from the fluorescent plate 120. However, this light (fluorescent light) has low directivity and accordingly lessens the dependence of the PD current amount on θ. This makes precise anomaly detection difficult. The reflected light P2 from the fluorescent plate 120 is therefore preferred in detecting an anomaly in the fluorescent plate 120.

In the first embodiment, where the light receiving element part 130 is provided to detect the reflected light P2 from the fluorescent plate 120 as described above, an anomaly in the fluorescent plate 120 (for example, the falling off, chipping (damaging), or displacing of the fluorescent plate 120) can be detected based on a change in the reflected light P2 (for example, a lowering in reflected light intensity). Based on a detection signal from the light receiving element part 130, the light source control part 140 controls laser light emitted from the semiconductor laser element 110, thereby preventing the laser light from the semiconductor laser element 110 from leaking directly to the outside in the event of an accident such as the detaching of or damage to the fluorescent plate 120. The laser light from the semiconductor laser element 110 is thus prevented from directly hitting a person's body and is consequently prevented from directly entering the person's eye. The illumination device 100 structured as described above is therefore improved in safety to the human eye.

In the first embodiment, where the illumination device 100 is provided with the light receiving element part 130 to facilitate the detection of an anomaly in the fluorescent plate 120 as described above, the safety is improved without complicating the structure of the illumination device 100. In other words, an improvement in safety is accomplished with a simple structure. The illumination device 100 can therefore be reduced in size with ease.

The illumination device 100 according to the first embodiment, which is easy to simplify the structure and to reduce the size, is readily applicable to uses where structural simplification is imperative, such as general illumination including home illumination and automobile headlights, and light sources for displays.

As described above, the illumination device 100 according to the first embodiment ensures safety with a simple system by stopping the driving of the semiconductor laser element 110 instantly when the fluorescent plate 120 develops an anomaly that can cause laser light emitted from the semiconductor laser element 110 to enter a person's eye. The illumination device 100 according to the first embodiment can therefore be applied to an automobile headlight, where the chance of the fluorescent plate developing an anomaly such as displacing, falling off, or damage is high due to vibrations during driving, an impact from a collision or a contact, and the like, to give the automobile headlight excellent safety.

In the first embodiment, the fluorescent plate 120 is provided with the reflective region 121 formed through deposition of a metal material such as aluminum, thereby increasing the amount of light that travels toward the light receiving element part 130 and enhancing the detection accuracy of the light receiving element part 130. The safety to the human eye is thus improved even more.

In the first embodiment, where the light receiving element part 130 outputs a detection signal to the light source control part 140 upon detecting a change in reflected light intensity which corresponds to the displacement amount of the fluorescent plate 120, it is easy to detect how laser light from the semiconductor laser element 110 is being supplied to the fluorescent plate 120. The displacing of the fluorescent plate 120 or a similar accident is thus prevented from causing the inconvenience of at least a portion of laser light from the semiconductor laser element 110 leaking directly to the outside.

In the first embodiment, where the fluorescent plate 120 is formed to have a plate-like shape, it is easy to set up the fluorescent plate 120 such that the reflected light P2 enters the light receiving element part 130. Another advantage of forming the fluorescent plate 120 into a plate-like shape is that the machining of the fluorescent plate 120 is simple.

Second Embodiment

Figure 5:
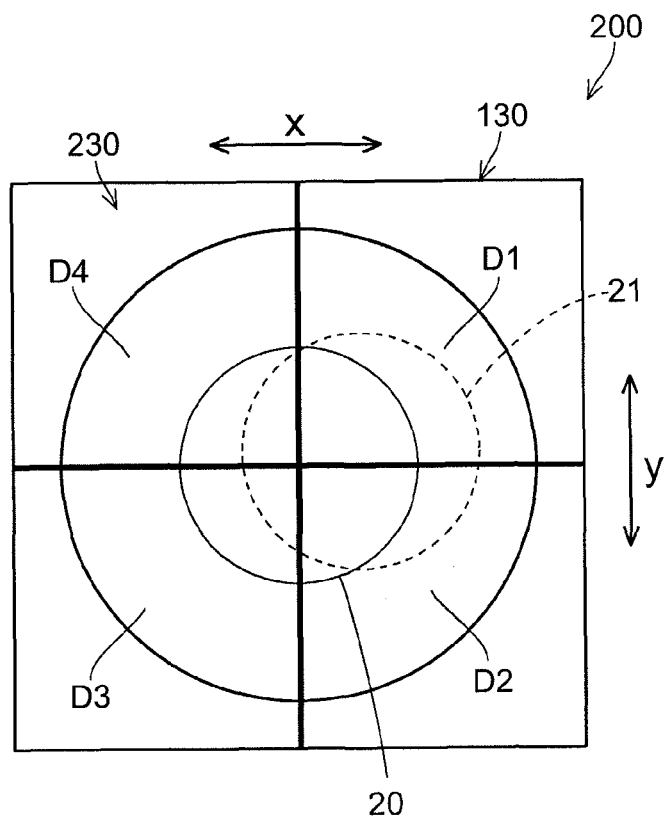
FIG. 5 is a plan view illustrating a light receiving surface of a quadrant detector of an illumination device according to a second embodiment of the present invention.
Figure 6:
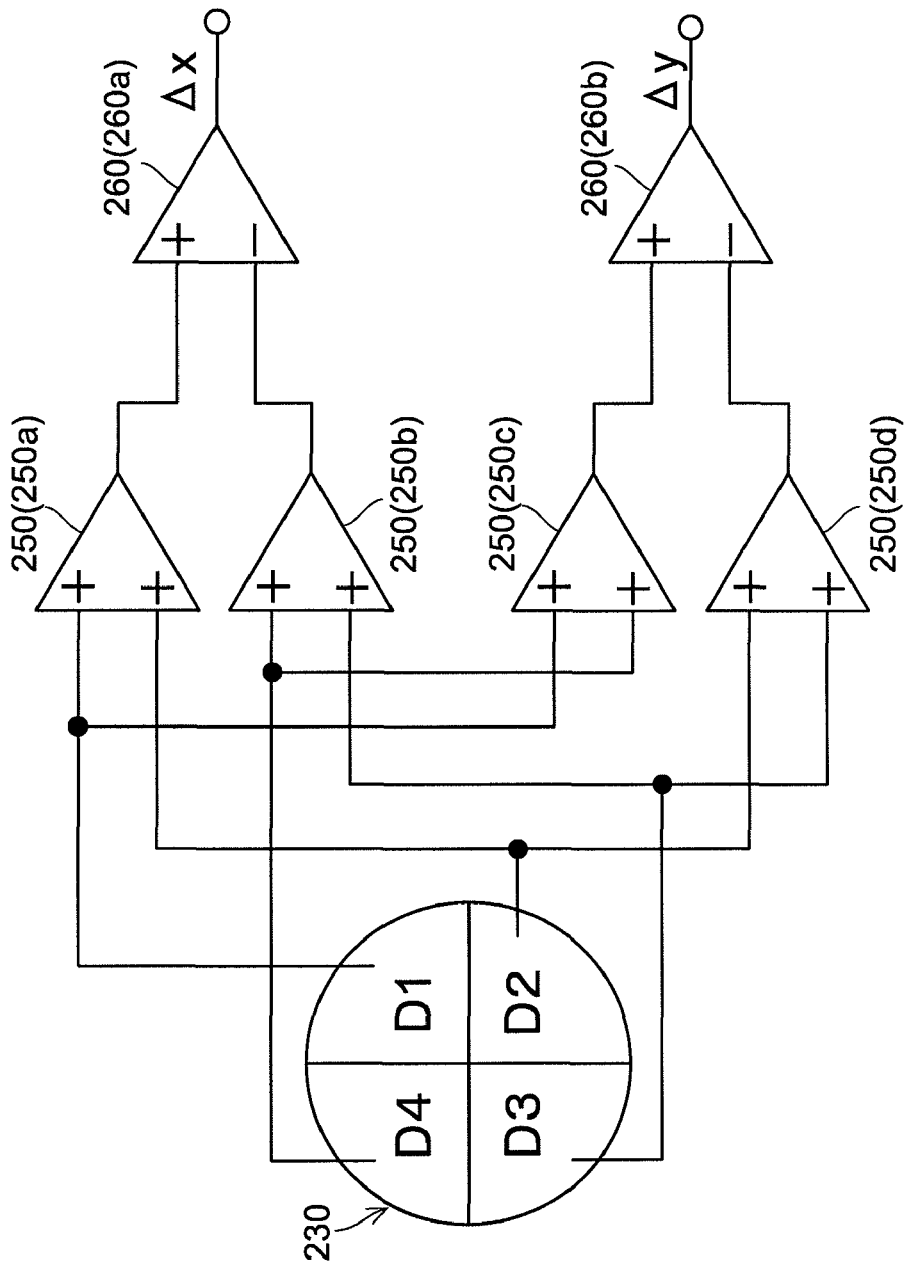
FIG. 6 is a circuit diagram for calculating the displacement amount of a fluorescent plate of the illumination device according to the second embodiment of the present invention.

FIG. 5 is a plan view illustrating a light receiving surface of a quadrant detector of an illumination device according to a second embodiment of the present invention. FIG. 6 is a circuit diagram for calculating the displacement amount of a fluorescent plate of the illumination device according to the second embodiment of the present invention. A circle 20 indicated by the solid line of FIG. 5 represents a region that is irradiated with the reflected light P2 from the fluorescent plate when the fluorescent plate is in its normal position, whereas a circle 21 indicated by the broken line of FIG. 5 represents an example of a region that is irradiated with the reflected light P2 from the fluorescent plate when the fluorescent plate is not in the normal position. FIG. 6 is an example of a circuit diagram for calculating an amount by which the fluorescent plate is displaced. The illumination device according to the second embodiment of the present invention which is denoted by 200 is described next with reference to FIGS. 1, 2, 5, and 6.

The illumination device 200 according to the second embodiment is obtained by modifying the structure of the first embodiment such that the light receiving element part 130 (see FIG. 1) includes a quadrant detector 230. The quadrant detector 230 has, as illustrated in FIG. 5, four light receiving regions D1 to D4. When a direction parallel to a radius direction of the fluorescent plate 120 (see FIG. 2) is given as a direction X and a direction parallel to a tangent direction of the fluorescent plate 120 (see FIG. 2) is given as a direction Y, the light receiving regions D1 to D4 divide the quadrant detector 230 in the direction X and in the direction Y.

The center of the optical axis of the reflected light P2 is positioned at the center of the quadrant detector 230 when the fluorescent plate 120 is in the normal position. When an impact to the fluorescent plate 120 or the like displaces the fluorescent plate 120 from its normal position, the reflected light P2 is shifted as well.

When the intensity levels of light received by the light receiving regions D1 to D4 are given as $I_1$ to $I_4$, respectively, a displacement amount $\Delta x$ in the direction X and a displacement amount $\Delta y$ in the direction Y are respectively calculated by the following Expressions (1) and (2).

$$\Delta x = (I_1 + I_2) - (I_3 + I_4) \tag{1}$$

$$\Delta y = (I_1 + I_4) - (I_2 + I_3) \tag{2}$$

The displacement amount of the fluorescent plate 120 can be calculated with the use of a circuit illustrated in FIG. 6 which includes adders 250 and subtracters 260.

Specifically, to calculate the displacement amount $\Delta x$ in the direction X, an adder 250*a* adds the output $I_1$ of the light receiving region D1 and the output $I_2$ of the light receiving region D2, and an adder 250*b* adds the output $I_3$ of the light receiving region D3 and the output $I_4$ of the light receiving region D4. A subtracter 260*a* then performs a subtraction between the calculated value of the addition performed by the adder 250*a* and the calculated value of the addition performed by the adder 250*b*. The displacement amount $\Delta x$ in the direction X is calculated in this manner. To calculate the displacement amount $\Delta y$ in the direction Y, an adder 250*c* adds the output $I_1$ of the light receiving region D1 and the output $I_4$ of the light receiving region D4, and an adder 250*d* adds the output $I_2$ of the light receiving region D2 and the output $I_3$ of the light receiving region D3. A subtracter 260*b* then performs a subtraction between the calculated value of the addition performed by the adder 250*c* and the calculated value of the addition performed by the adder 250d. The displacement amount Δy in the direction Y is calculated in this manner.

The second embodiment is thus structured to detect an anomaly in the fluorescent plate 120 by calculating the displacement amount of the fluorescent plate 120 with the use of the circuit illustrated in FIG. 6. In the second embodiment, a certain displacement amount is set as an anomaly detection level and, when this displacement amount is exceeded, a detection signal is sent to the light source control part 140 (see FIG. 1) to break electrical continuity to the semiconductor laser element 110 (see FIG. 1).

In the case where the fluorescent plate 120 falls off or other accidents that make the displacement amount too large happen, the reflected light P2 is no longer detected by the light receiving element part 130 (quadrant detector 230). By structuring the illumination device 200 to break electrical continuity to the semiconductor laser element 110 (see FIG. 1) in the event of such accidents, the safety to the eye is easily improved.

The second embodiment provides the same effects as those of the first embodiment.

Third Embodiment

Figure 7:
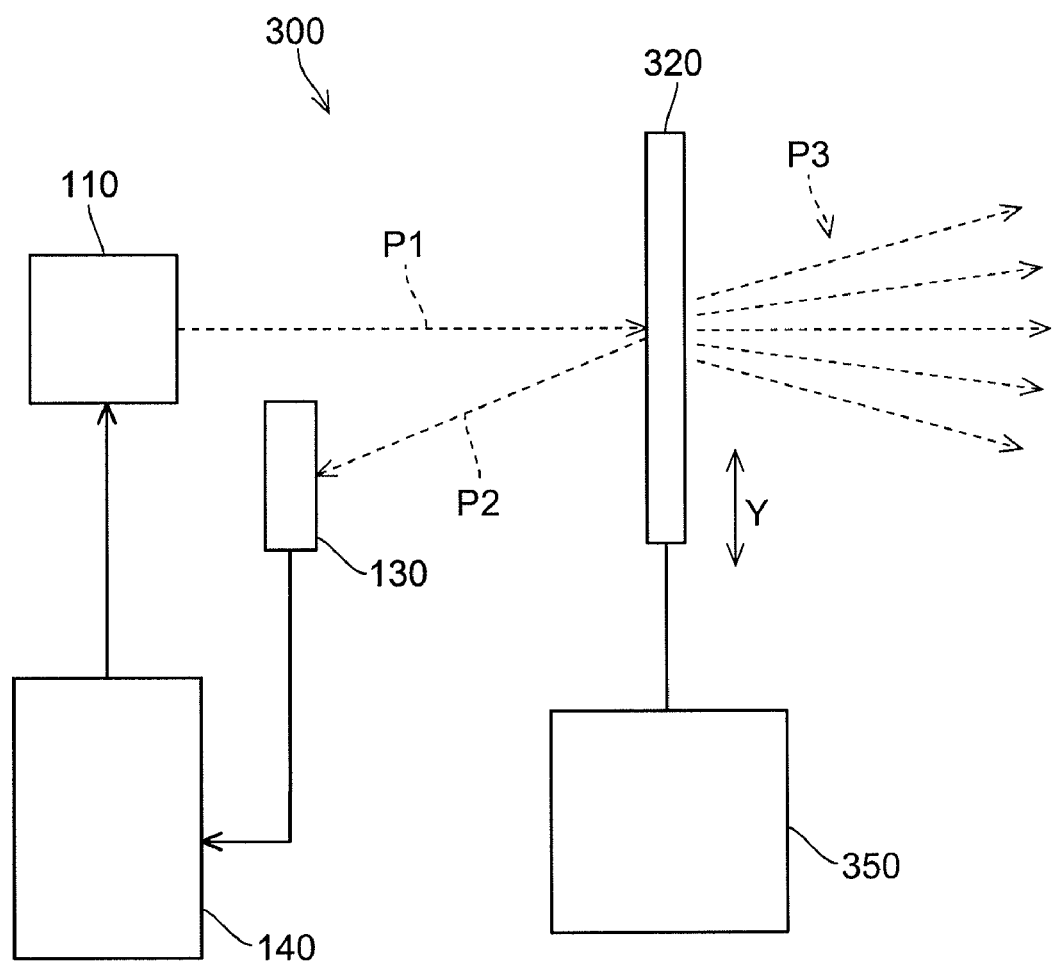
FIG. 7 is a block diagram schematically illustrating the structure of an illumination device according to a third embodiment of the present invention.
Figure 8:
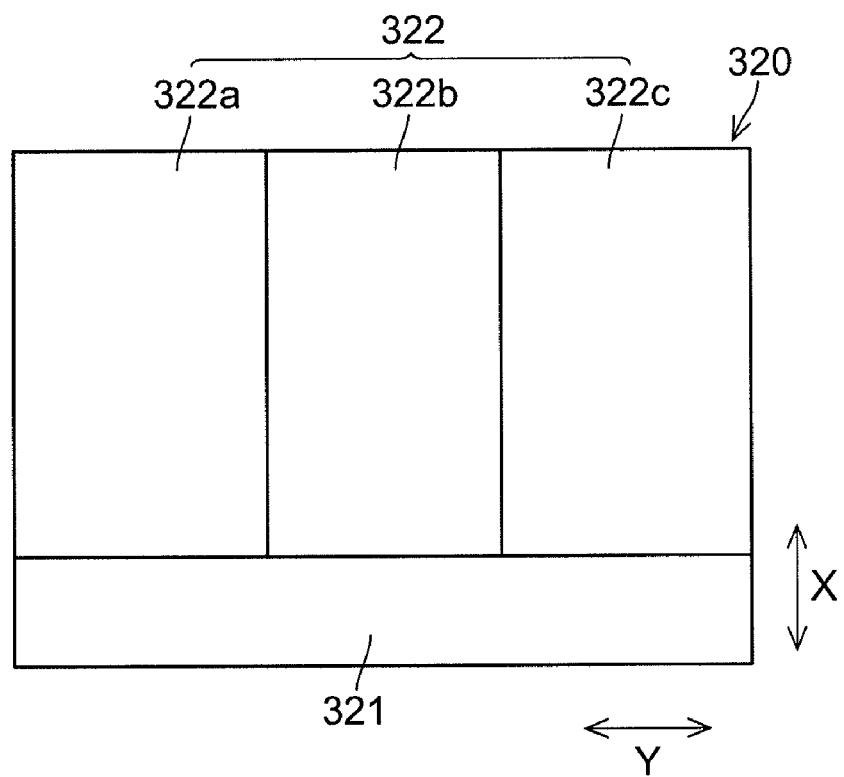
FIG. 8 is a plan view of a fluorescent plate of the illumination device according to the third embodiment of the present invention.

FIG. 7 is a block diagram schematically illustrating the structure of an illumination device according to a third embodiment of the present invention. FIG. 8 is a plan view of a fluorescent plate of the illumination device according to the third embodiment of the present invention. The fluorescent plate of FIG. 8 is viewed from the semiconductor laser element side. The illumination device according to the third embodiment of the present invention which is denoted by 300 is described next with reference to FIGS. 5, 7, and 8.

The illumination device 300 according to the third embodiment is obtained by modifying the structure of the first embodiment such that a fluorescent plate 320 is moved in the top-bottom direction (direction Y) by a fluorescent plate driving part 350 as illustrated in FIG. 7. The fluorescent plate driving part 350 includes, for example, a stepping motor or a tracking motor. The fluorescent plate 320 is an example of the "fluorescent member" of the present invention, and the fluorescent plate driving part 350 is an example of a "fluorescent member driving part" of the present invention.

The fluorescent plate 320 in the third embodiment includes, as illustrated in FIG. 8, a plurality of regions in which a plurality of types of fluorescent substances are provided. Specifically, the fluorescent plate 320 is formed into a substantially rectangular shape in plan view, and has a fluorescent region 322 divided into three regions (fluorescent region 322a, fluorescent region 322b, and fluorescent region 322c). The fluorescent substance types and fluorescent substance blending ratios of the fluorescent regions 322a to 322c are adjusted such that the fluorescent regions 322a to 322c each emit light of a different color. For example, the fluorescent regions 322a to 322c are designed such that, while a red fluorescent substance, a green fluorescent substance, and a blue fluorescent substance are contained in every region to emit white light, each region contains the fluorescent substances of the three colors in a different blending ratio to have a different color temperature.

The fluorescent plate 320 is also provided with a reflective region 321, which is in contact with all of the fluorescent regions 322a to 322c. The reflective region 321 is, as in the first embodiment, formed by deposition of a metal material such as aluminum. Alternatively, the reflective region 321 may be created from, for example, a dielectric minor in which dielectric films having different refractive indices are layered alternately. The structure of FIG. 8 is an example of the fluorescent plate of the third embodiment, and other fluorescent plate structures than this may be employed in the third embodiment. The fluorescent regions and the reflective region, too, can be allocated and arranged in other various patterns than the one illustrated in FIG. 8.

In the illumination device 300 according to the third embodiment which is structured as described above, which region of the fluorescent plate 320 is irradiated with laser light emitted from the semiconductor laser element 110 (exit light P1) can be changed by moving the fluorescent plate 320 with the use of the fluorescent plate driving part 350. Changing the illumination light P3 is thus made simple. For example, the color or tint of the illumination light P3 emitted from the fluorescent plate 320 can be changed.

The rest of the structure of the third embodiment is the same as the first embodiment.

In the illumination device 300 according to the third embodiment, the light receiving element part 130 may include the quadrant detector 230 (see FIG. 5) as in the second embodiment.

The third embodiment provides the same effects as those of the first and second embodiments.

Fourth Embodiment

Figure 9:
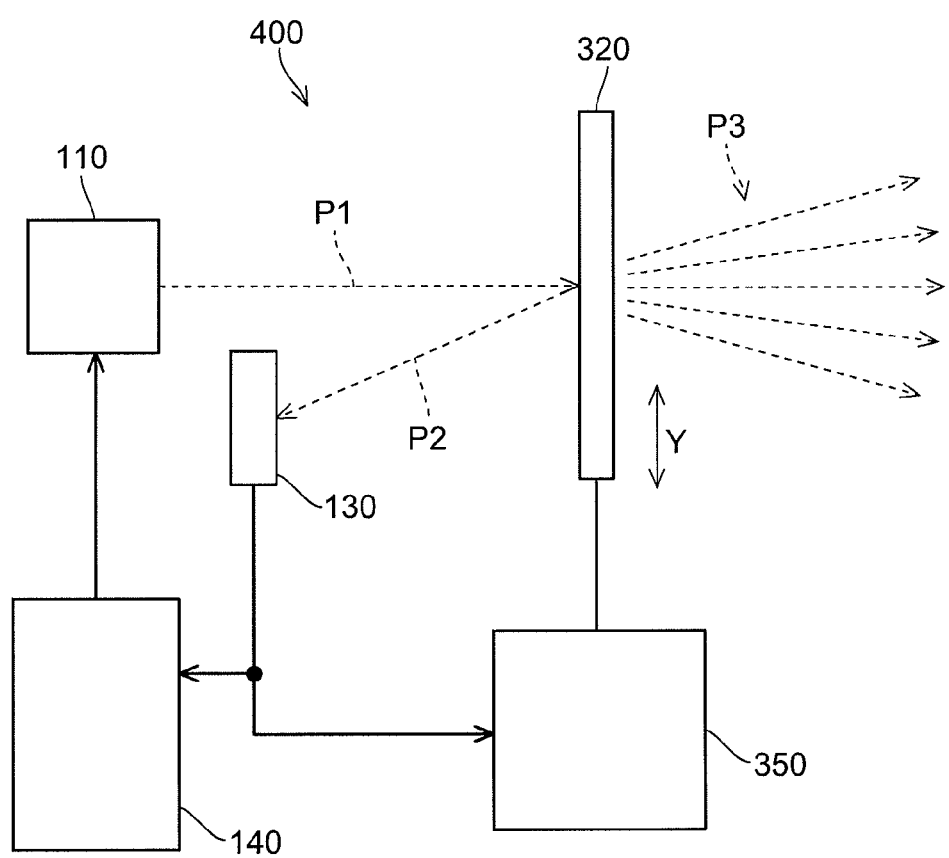
FIG. 9 is a block diagram schematically illustrating the structure of an illumination device according to a fourth embodiment of the present invention.
Figure 10:
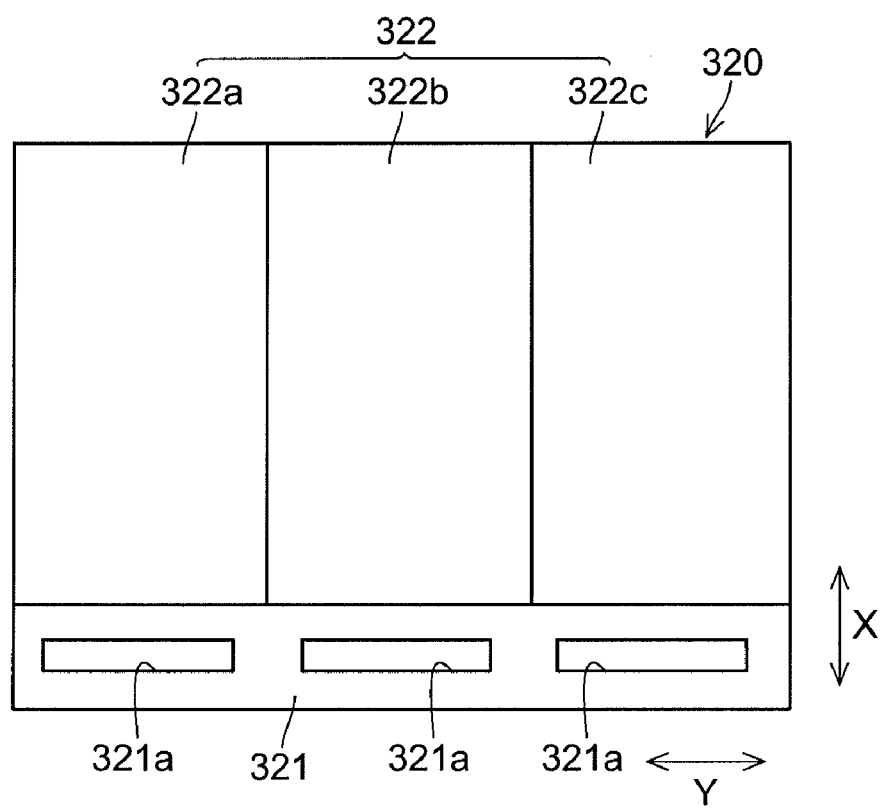
FIG. 10 is a plan view of a fluorescent plate of the illumination device according to the fourth embodiment of the present invention.
Figure 11:
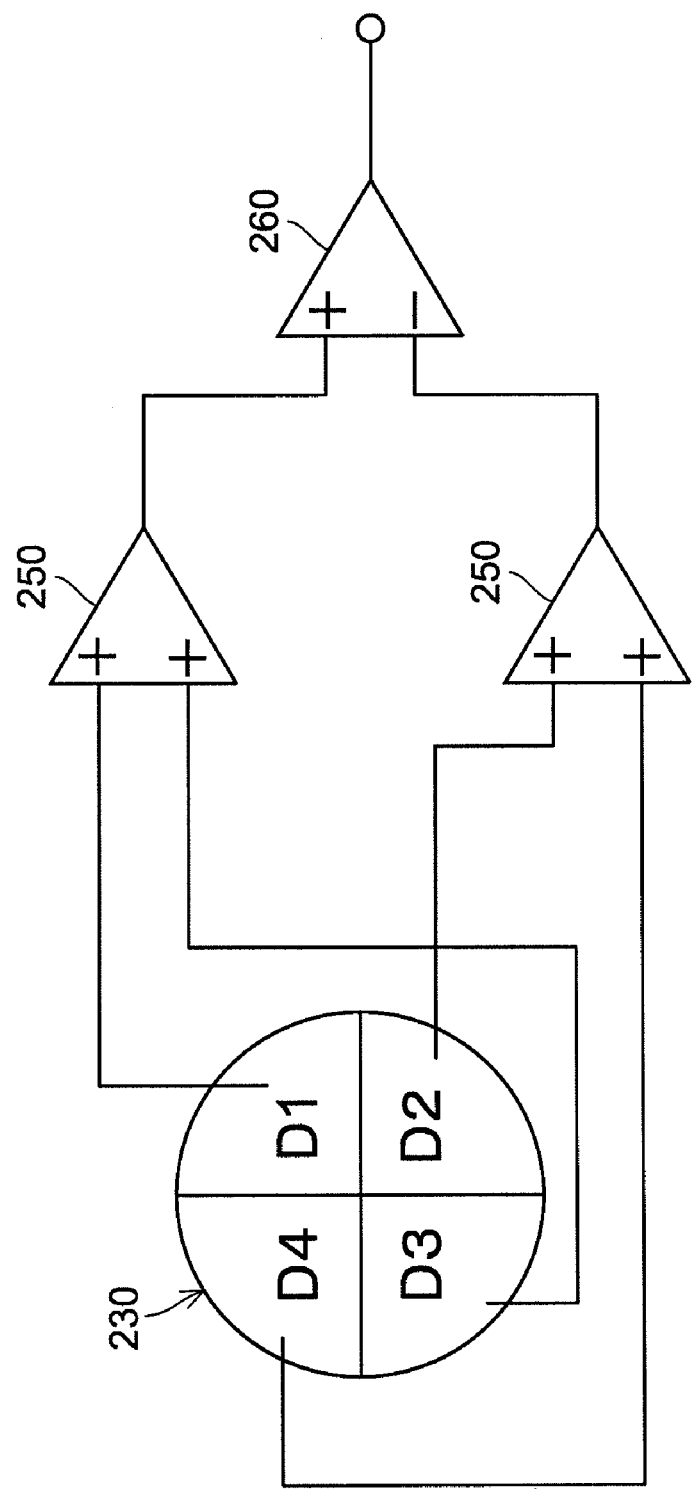
FIG. 11 is a circuit diagram for calculating the displacement amount of the fluorescent plate of the illumination device according to the fourth embodiment of the present invention.

FIG. 9 is a block diagram schematically illustrating the structure of an illumination device according to a fourth embodiment of the present invention. FIG. 10 is a plan view of a fluorescent plate of the illumination device according to the fourth embodiment of the present invention. FIG. 11 is a circuit diagram for calculating the displacement amount of the fluorescent plate of the illumination device according to the fourth embodiment of the present invention. The fluorescent plate of FIG. 10 is viewed from the semiconductor laser element side. FIG. 11 is an example of a circuit diagram for calculating the displacement amount in order to accurately control the position of the fluorescent plate based on the intensity of light received by a quadrant detector. The illumination device according to the fourth embodiment of the present invention which is denoted by 400 is described next with reference to FIG. 5 and FIGS. 9 to 11.

The illumination device 400 according to the fourth embodiment is obtained by modifying the structure of the third embodiment such that the fluorescent plate driving part 350 is connected to the light receiving element part 130 as illustrated in FIG. 9. The light receiving element part 130 includes the quadrant detector 230 of FIG. 5, and the displacement amount of the fluorescent plate 320 which is detected by the quadrant detector 230 is fed back to the fluorescent plate driving part 350.

The fluorescent plate 320 has, as illustrated in FIG. 10, concave parts 321a in its reflective region 321 in, for example, a linear pattern. The reflected light P2 (see FIG. 9) from the concave parts 321a is received by the light receiving element part 130, which thereby monitors the position of the fluorescent plate 320. The structure of FIG. 10 is an example of the fluorescent plate 320 according to the fourth embodiment, and other structures may be employed instead.

When the intensity levels of light received by the light receiving regions D1 to D4 of the quadrant detector 230 are given as $I_1$ to $I_4$, respectively, a diagonal difference signal $(I_1+I_3)-(I_2+I_4)$ is calculated with the use of a circuit as illustrated in FIG. 11 to calculate a displacement amount in the left-right direction (direction X). The calculated displacement amount is fed back to the fluorescent plate driving part 350, which enables the fluorescent plate driving part 350 to move the fluorescent plate 320 in the top-bottom direction (direction Y) while preventing a displacement in the left-right direction (direction X). The fluorescent plate 320 is accurately moved to a desired position in this manner.

The fourth embodiment provides the same effects as those of the first to third embodiments. The reflective region 321 of the fluorescent plate 320 in the fourth embodiment may have convex parts in place of the concave parts 321a. The reflective region 321 may also have a mix of convex parts and concave parts.

Fifth Embodiment

Figure 12:
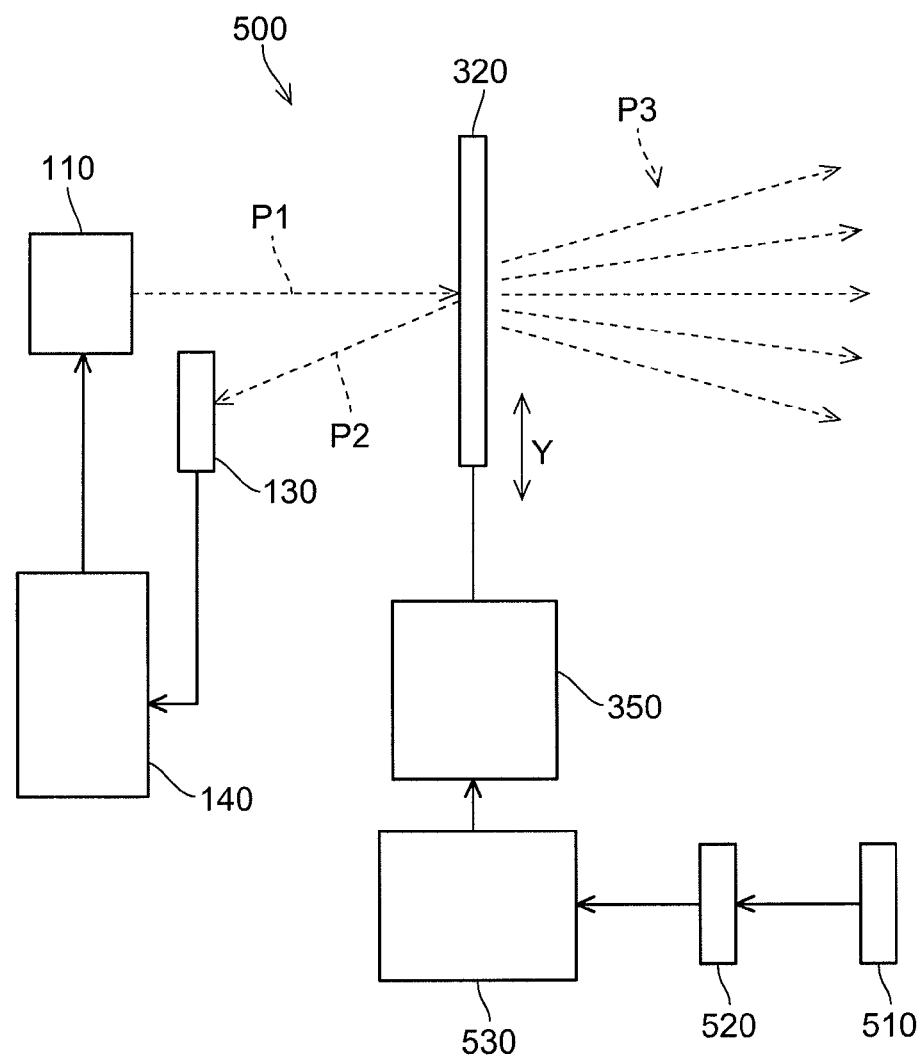
FIG. 12 is a block diagram schematically illustrating the structure of an illumination device according to a fifth embodiment of the present invention.

FIG. 12 is a block diagram schematically illustrating the structure of an illumination device according to a fifth embodiment of the present invention. The illumination device according to the fifth embodiment of the present invention which is denoted by 500 is described next with reference to FIGS. 5 and 12.

The illumination device 500 according to the fifth embodiment is obtained by adding an environment detecting part 510, a color temperature information processing part 520, and a fluorescent plate control part 530 to the structure of the third embodiment as illustrated in FIG. 12.

The environment detecting part 510 detects an environment in which the illumination device 500 is placed. Specifically, the environment detecting part 510 includes a lux sensor, a temperature sensor, and a humidity sensor among other components, and detects the surrounding situation such as brightness and weather (climate). The environment detecting part 510 outputs the obtained environment data as a signal to the color temperature information processing part 520.

The color temperature information processing part 520 holds appropriate color temperature information in association with environment data obtained by the environment detecting part 510, such as illuminance, temperature, and humidity. Appropriate color temperature information is allocated to environment data from the viewpoint of illumination engineering. The color temperature information processing part 520 is connected to the environment detecting part 510 and chooses a color temperature suitable for a detected environment based on a signal from the environment detecting part 510. The chosen color temperature is output as a color temperature information signal to the fluorescent plate control part 530.

The fluorescent plate control part 530 is connected to the color temperature information processing part 520 and, in response to a color temperature information signal from the color temperature information processing part 520, outputs to the fluorescent plate driving part 350 a drive control signal for driving the fluorescent plate 320 to a position that enables the fluorescent plate 320 to emit light of the received color temperature.

The rest of the structure of the illumination device 500 according to the fifth embodiment is the same as the third embodiment.

In the illumination device 500 according to the fifth embodiment, the light receiving element part 130 may include the quadrant detector 230 (see FIG. 5) as in the second embodiment.

Described next with reference to FIG. 12 is the operation of the illumination device 500 according to the fifth embodiment.

The environment detecting part 510 obtains environment data, which is then sent as a signal from the environment detecting part 510 to the color temperature information processing part 520. Receiving the signal from the environment detecting part 510, the color temperature information processing part 520 chooses out of the stored color temperature information a color temperature that is suitable to the detected environment based on the signal from the environment detecting part 510. The chosen color temperature is output as a color temperature information signal to the fluorescent plate control part 530.

The fluorescent plate control part 530 chooses one of the fluorescent regions of the fluorescent plate 320 that enables the fluorescent plate 320 to emit light of the color temperature output from the color temperature information processing part 520. The fluorescent plate control part 530 controls the fluorescent plate driving part 350 to move the fluorescent plate 320 to a position where the chosen fluorescent region is irradiated with laser light emitted from the semiconductor laser element 110 (exit light P1).

In this manner, the illumination device 500 identifies what color of the illumination light P3 is favorable for the environment in which the illumination device 500 is placed and automatically changes the tint or the like of the illumination light P3. In the process, the reflected light P2 from the fluorescent plate 320 is detected, to thereby detect an anomaly in the fluorescent plate 320 and ensure the safety of the illumination device 500.

Structured as described above, the illumination device 500 according to the fifth embodiment can easily change the tint or the like of the illumination light P3 to suit the external environment in which the illumination device 500 is placed. In the process, the light receiving element part 130 monitors the reflected light P2 from the fluorescent plate 320, to thereby detect an anomaly in the fluorescent plate 320 and prevent light emitted from the semiconductor laser element 110 from entering a person's eye.

Sixth Embodiment

Figure 13:
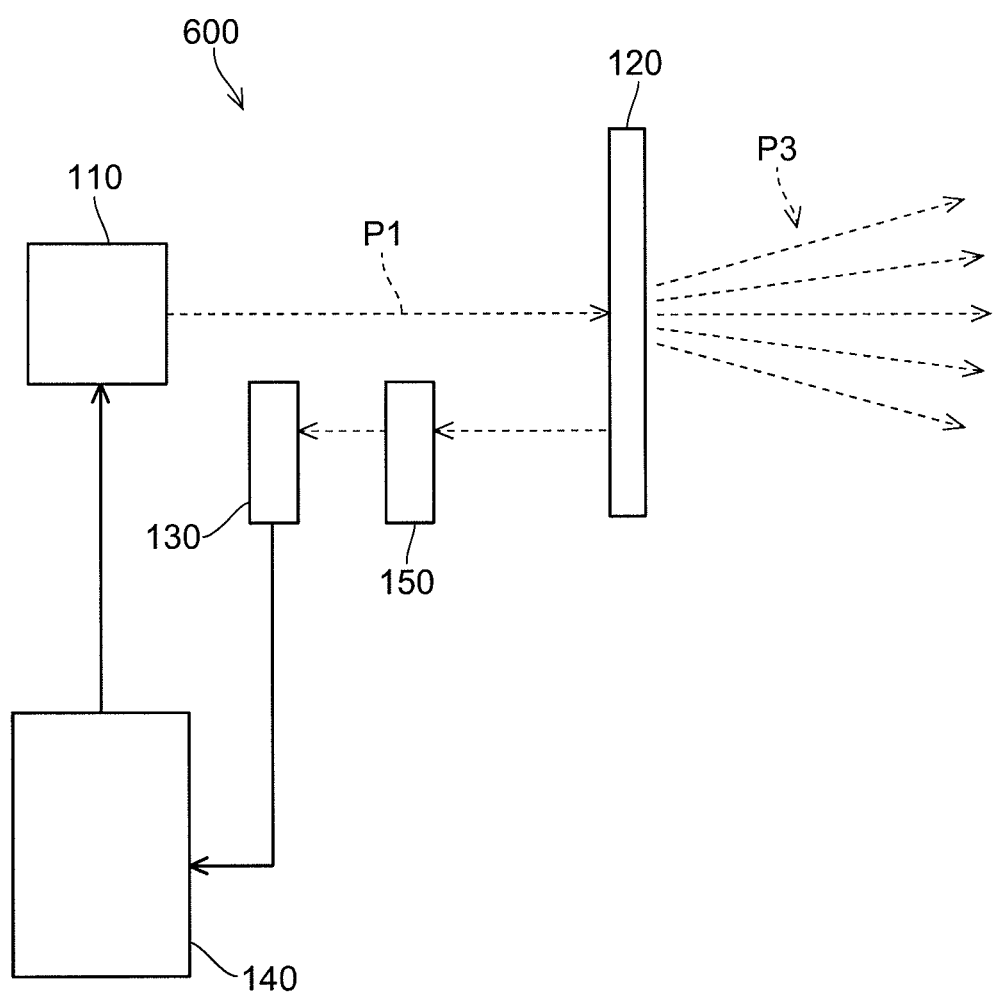
FIG. 13 is a block diagram schematically illustrating the structure of an illumination device according to a sixth embodiment of the present invention.

FIG. 13 is a block diagram schematically illustrating the structure of an illumination device according to a sixth embodiment of the present invention. The illumination device according to the sixth embodiment of the present invention which is denoted by 600 is described next with reference to FIG. 13. In the sixth embodiment, components similar to those in the first embodiment are denoted by the same reference symbols, and their descriptions are omitted.

In the illumination device 600 according to the sixth embodiment, an optical filter 150 is provided between the fluorescent plate 120 and the light receiving element part 130 as illustrated in FIG. 13. The optical filter 150 has functions of blocking light that has been subjected to wavelength conversion by a fluorescent substance and transmitting laser light. The fluorescent plate 120 in the sixth embodiment has no reflective region unlike the first embodiment.

In the sixth embodiment where the optical filter 150 is provided between the fluorescent plate 120 and the light receiving element part 130, at least a portion of illumination light emitted from the fluorescent plate 120 is blocked by the optical filter 150. Therefore, when illumination light from the fluorescent plate 120 is emitted toward the light receiving element part 130 in addition to reflected light of the semiconductor laser element 110, the illumination light is blocked and prevented from entering the light receiving element part 130, with the result that the reflected light of the semiconductor laser element 110 alone is detected.

The optical filter 150 is, for example, an optical filter that transmits blue-violet light and blocks blue light, green light, and red light when the employed excitation light source is a blue-violet laser having a wavelength of 405 nm and the fluorescent plate 120 uses fluorescent substances that emit blue light, green light, and red light. In the case where the employed excitation light source is an ultraviolet semiconductor laser, the optical filter 150 is preferably one that blocks only visible light. A concrete example of the optical filter 150 is UTVAF-33U, a product of SIGMA KOKI Co., Ltd.

The rest of the structure of the sixth embodiment is the same as the first embodiment.

In the sixth embodiment, the optical filter 150 which blocks illumination light is provided between the fluorescent plate 120 and the light receiving element part 130 as described above, and the light receiving element part 130 thus detects only reflected light that has been reflected by the fluorescent plate 120. This improves the accuracy of detecting reflected light even more and accordingly enhances the precision of detecting an anomaly in the fluorescent plate 120. The illumination device 600 therefore has an even more improved safety to the human eye.

Further, in the sixth embodiment, the optical filter 150 is provided to selectively detect reflected light without providing a reflective region in the fluorescent plate 120. This eliminates the difficulty of taking out illumination light from the reflective region in the fluorescent plate 120, and prevents the lowering of the illumination light take-out ratio.

Although the fluorescent plate 120 preferably has no reflective region when the optical filter 150 is provided between the fluorescent plate 120 and the light receiving element part 130, the fluorescent plate 120 may be provided with a reflective region.

The optical filter 150 may be placed at a given distance from the light receiving element part 130 as illustrated in FIG. 13, or may be attached to the light receiving element part 130.

Seventh Embodiment

Figure 14:
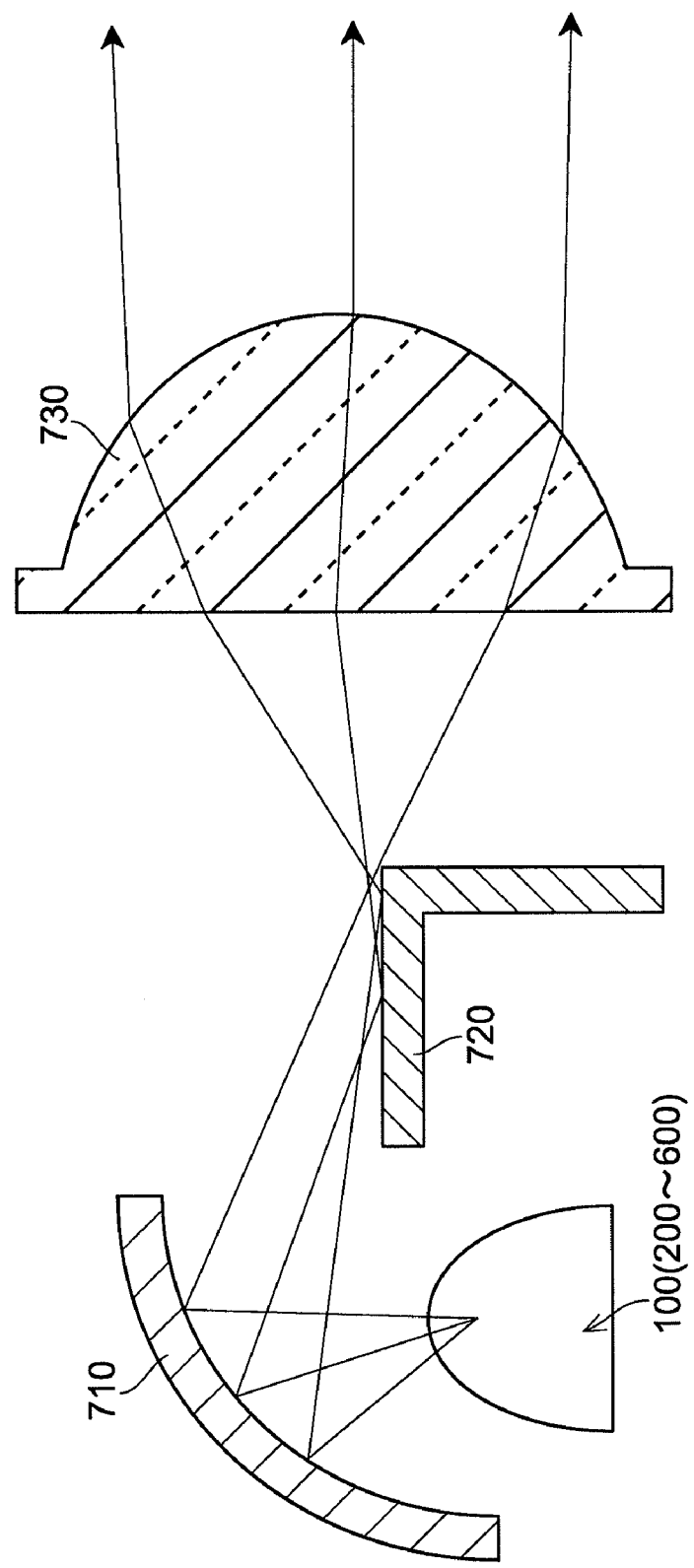
FIG. 14 is a schematic diagram illustrating the structure of an automobile headlight according to a seventh embodiment of the present invention.

FIG. 14 is a schematic diagram illustrating the structure of an automobile headlight according to a seventh embodiment of the present invention. The automobile headlight according to the seventh embodiment of the present invention is described next with reference to FIG. 14. The seventh embodiment deals with an example of applying the present invention to an automobile headlight, which is an example of automotive lighting equipment.

The automobile headlight according to the seventh embodiment includes the illumination device 100 of the first embodiment as illustrated in FIG. 14. Any of the illumination devices 200 to 600 of the second to sixth embodiments may be employed instead of the illumination device 100 of the first embodiment. Alternatively, the automobile headlight may use an illumination device that is obtained by combining the structures of the first to sixth embodiments as needed.

The automobile headlight according to the seventh embodiment also includes a first reflector 710, a second reflector 720, and a projection lens 730. Light from the illumination device 100 reaches the projection lens 730 via the first reflector 710 and the second reflector 720, and is cast from the projection lens 730 toward the space in front of the vehicle.

Structured as above, the automobile headlight according to the seventh embodiment is reduced in size and improved in safety to the human eye.

Employing the illumination device 500 of the fifth embodiment instead of the illumination device 100 enables the automobile headlight to change the tint of its light to suit the surrounding situation.

The automobile headlight can be mounted to a vehicle such as a four-wheel automobile or a two-wheel motorcycle.

Eighth Embodiment

A vehicle according to an eighth embodiment of the present invention is a vehicle to which the automobile headlight of the seventh embodiment is mounted. The vehicle may be a four-wheel automobile or a two-wheel motorcycle.

Ninth Embodiment

Figure 15:
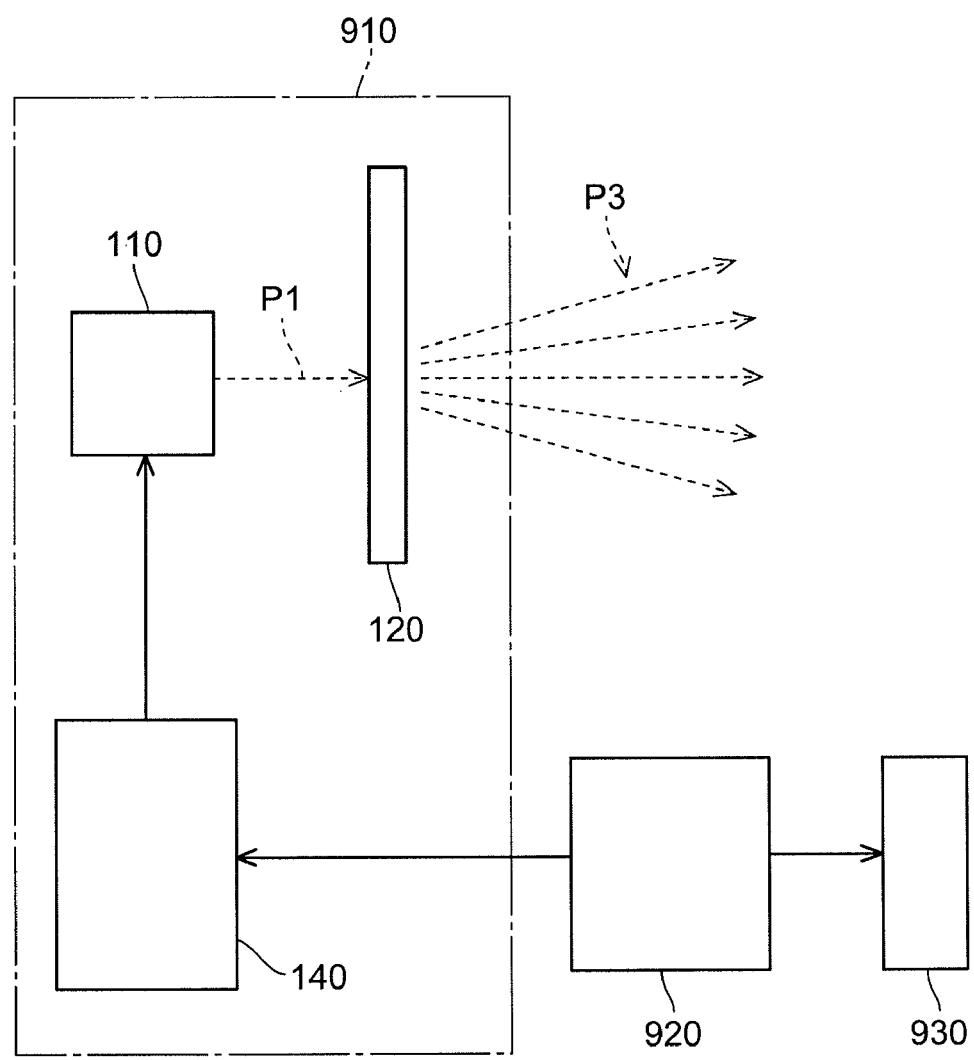
FIG. 15 is a block diagram schematically illustrating the structure of a vehicle according to a ninth embodiment of the present invention.

FIG. 15 is a block diagram schematically illustrating the structure of a vehicle according to a ninth embodiment of the present invention. The vehicle according to the ninth embodiment of the present invention is described next with reference to FIG. 15.

The vehicle according to the ninth embodiment includes, as illustrated in FIG. 15, an automobile headlight 910 similar to the automobile headlight of the seventh embodiment. The automobile headlight 910, however, uses an illumination device whose structure differs from the one in the automobile headlight of the seventh embodiment. Specifically, whereas the automobile headlight of the seventh embodiment uses an illumination device that is provided with a light receiving element part, the automobile headlight 910 of the ninth embodiment uses an illumination device that does not include a light receiving element part. The fluorescent plate 120 therefore may not be provided with a reflective region.

In the ninth embodiment, a collision detecting part 920 for detecting a collision of the vehicle is connected to the light source control part 140 instead of providing the illumination device of the automobile headlight 910 with a light receiving element part. In other words, the ninth embodiment is structured such that the collision detecting part 920 sends a signal to the light source control part 140 upon detecting a collision of the vehicle.

The light source control part 140 functions to break electrical continuity to the semiconductor laser element 110 upon reception of the signal from the collision detecting part 920.

The collision detecting part 920 is also connected to an airbag 930 and, detecting a collision of the vehicle, activates the airbag 930. The collision detecting part 920 includes an acceleration sensor and other components. The collision detecting part 920 and the airbag 930 can employ, for example, a system described in JP 2005-145381 A.

In this manner, the collision detecting part 920 used to activate the airbag 930 is also incorporated in the control of the semiconductor laser element 110 of the automobile headlight 910, which simplifies the system (structure). This structure also enables the vehicle to stop the driving of the semiconductor laser element 110 of the automobile headlight 910 (to turn off the light source) when the collision detecting part 920 detects a collision of the vehicle. Laser light emitted from the semiconductor laser element 110 is thus prevented from entering the eyes of people in the vicinity of the vehicle when the vehicle is damaged from a collision.

The embodiments disclosed herein are, in every respect, exemplifications, and should not be construed as limitations on the scope of the invention. The scope of the present invention is defined by the scope of claims, not by the description of the embodiments given above, and contains every modification within the scope and meaning equivalent to the terms of the claims.

For instance, while the first to ninth embodiments deal with examples in which a fluorescent substance (fluorescent member) is shaped like a plate, the present invention is not limited thereto and a fluorescent substance (fluorescent member) may be formed into other shapes than a plate-like shape.

The first to ninth embodiments deal with examples in which a semiconductor laser element is used as an excitation light source, but the present invention is not limited thereto and other excitation light sources than a semiconductor laser element may be used. The employed excitation light source may be one selected from, for example, various solid-state lasers, light emitting diodes, and superluminescent diodes. Irradiating the human body directly is undesirable even when the employed light source is a light emitting diode if the light source is to emit ultraviolet light or similar light. The present invention improves the safety also when the excitation light source in the disclosed embodiments is a light emitting diode.

In the case where the employed excitation light source is a high-power light emitting diode, the present invention lessens glare.

The first to ninth embodiments deal with examples in which a semiconductor laser element made from a nitride-based semiconductor is used. However, the present invention is not limited thereto and other semiconductor laser elements than a nitride-based semiconductor may be employed.

The first to ninth embodiments deal with examples in which a single semiconductor laser element is included as an excitation light source. However, the present invention is not limited thereto and a plurality of excitation light sources may be included. For instance, a plurality of semiconductor laser elements (laser chips) may be laid out. To give another example, a bar-shaped semiconductor laser element (laser chip), in which a plurality of light emission points are formed, may be employed. Alternatively, a plurality of packaged semiconductor laser elements may constitute a single excitation source.

The first to ninth embodiments deal with examples in which the fluorescent plate is provided with a reflective region. The reflective region is not always necessary because fluorescent substances in general reflect light.

The first to eighth embodiments deal with examples in which the light receiving element part serving as the reflected light sensing part includes a photodiode or a quadrant detector. However, the present invention is not limited thereto and the light receiving element part may include a light receiving element that is not a photodiode or a quadrant detector (for example, a phototransistor). The reflected light sensing part may be a photoelectric tube, a photoelectron multiplier tube, or the like instead of a semiconductor light receiving element.

The illumination device structures of the first to sixth embodiments may be combined as needed.

In the illumination devices of the first to sixth embodiments, a component for narrowing the width of a light beam (for example, an optical fiber or an optical waveguide) may be put between the semiconductor laser element (excitation light source) and the fluorescent plate.

In the first to fifth embodiments, an optical filter as the one described in the sixth embodiment may be placed between the fluorescent plate (fluorescent member) and the light receiving element part (reflected light sensing part). Reflected light from the fluorescent plate can be detected efficiently without an optical filter if, for example, the light receiving element part is given light receiving characteristics that have a peak wavelength in the vicinity of the wavelength of laser light.

The first, second, and sixth embodiments deal with examples in which the fluorescent plate is formed into a substantially circular shape. However, the present invention is not limited thereto and the fluorescent plate may have other shapes than a circular shape.

The first, second, and sixth embodiments deal with examples in which a reflective region is provided at substantially the center of the fluorescent plate. However, the present invention is not limited thereto and the fluorescent plate can have a reflective region in other areas than its center. The reflective region can be formed anywhere as long as it is within the range where light from the excitation light source irradiates the fluorescent plate.

The first, second, and sixth embodiments deal with examples in which the fluorescent plate is built from a single plate. However, the present invention is not limited thereto and the fluorescent plate may be built from a plurality of plates. For instance, three fluorescent plates including a fluorescent plate made from a blue fluorescent substance, a fluorescent plate made from a green fluorescent substance, and a fluorescent plate made from a red fluorescent substance may be stacked in order from the excitation light source side. In the case where this fluorescent plate is to have a reflective region, it is preferred that each fluorescent plate layer be provided with a separate reflective region. Other structures than this may also be employed.

The fourth embodiment deals with an example in which the reflective region of the fluorescent plate has concave parts formed in a linear pattern. However, the present invention is not limited thereto and the reflective region may have concave parts or convex parts formed in other patterns than a linear pattern. For instance, concave parts or convex parts in a dot pattern may be formed in the reflective region.

The third to fifth embodiments deal with examples in which the fluorescent plate is formed into a substantially rectangular shape. However, the present invention is not limited thereto and the fluorescent plate can have various other shapes including a circular shape.

In the third to fifth embodiments, the reflective region of the fluorescent plate can be formed anywhere as long as it is within the range where light from the light source (excitation light source) irradiates the fluorescent plate.

The seventh embodiment deals with an example of applying the present invention to an automobile headlight, which is an example of automotive lighting equipment. However, the present invention is not limited thereto and the present invention is applicable to other automotive lighting equipment than an automobile headlight. For instance, the present invention may be applied to a taillight, a blinker, or a fog light.

The ninth embodiment deals with an example of a vehicle that uses an illumination device different from those of the first to sixth embodiments, but the present invention is not limited thereto. The structure of the ninth embodiment may employ one of the illumination devices of the first to sixth embodiments, or an illumination device obtained by combining the structures of the first to sixth embodiments.

In the ninth embodiment, the automobile headlight may include a fluorescent plate and a fluorescent plate driving part for moving the fluorescent part as those described in the third embodiment.

What is claimed is:

1. An illumination device comprising:
   a light source which emits light of a specific wavelength;
   a fluorescent member which comprises a fluorescent substance and is irradiated with light emitted from the light source;
   a reflected light sensing part which detects the specific wavelength among light reflected from the fluorescent member; and
   a light source control part which controls light emitted from the light source based on a detection signal of the reflected light sensing part.

2. An illumination device according to claim 1, wherein the light source comprises a semiconductor laser element.

3. An illumination device according to claim 1, wherein the reflected light sensing part comprises a light receiving element.

4. An illumination device according to claim 1, wherein the reflected light sensing part detects a change in reflected light intensity which corresponds to a displacement amount of the fluorescent member, and then outputs the detection signal to the light source control part.

5. An illumination device according to claim 1, wherein the reflected light sensing part comprises a light receiving element, which is divided to have four light receiving regions.

6. An illumination device according to claim 1, wherein the fluorescent member is provided with a reflective region made from a material that is different from the fluorescent substance.

7. An illumination device according to claim 1, further comprising an optical filter, which is placed between the fluorescent member and the reflected light sensing part to block at least a portion of illumination light emitted from the fluorescent member.

8. An illumination device according to claim 1, wherein the fluorescent member is shaped like a plate.

9. An illumination device according to claim 1,
wherein the fluorescent member comprises a plurality of fluorescent regions designed to emit light of colors different from one another, and
wherein the illumination device further comprises a fluorescent member driving part for moving the fluorescent member.

10. An illumination device according to claim 6, wherein the reflective region has at least one of a convex part and a concave part.

11. An automotive lighting equipment comprising the illumination device according to claim 1.

12. An vehicle comprising the automotive lighting equipment according to claim 11.

13. A vehicle according to claim 12, further comprising a collision detecting part for detecting a collision,
wherein the light source control part controls light emitted from the light source based on a detection signal from the collision detecting part.

14. A vehicle comprising:
an automotive lighting equipment comprising an illumination device; and
a collision detecting part for detecting a collision,
wherein the illumination device comprises:
a light source which emits light of a specific wavelength;
a fluorescent member which is irradiated with light emitted from the light source; and
a light source control part which controls light emitted from the light source, and
wherein the light source control part controls light emitted from the light source based on a detection signal from the collision detecting part.

15. A vehicle according to claim 14, wherein the light source comprises a semiconductor laser element.

* * * * *